(12) United States Patent
Duineveld et al.

(10) Patent No.: US 6,762,552 B1
(45) Date of Patent: Jul. 13, 2004

(54) ORGANIC ELECTROLUMINESCENT DEVICE AND A METHOD OF MANUFACTURING THEREOF

(75) Inventors: Paulus Cornelis Duineveld, Eindhoven (NL); Jeroen Herman Lammers, Eindhoven (NL); Coen Theodorus Hubertus Liedenbaum, Eindhoven (NL); Jochem Petrus Maria De Koning, Eindhoven (NL); Cornelis Dirk Roelandse, Eindhoven (NL); Maria Henrica Wilhelmina Antonia Van Deurzen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/890,215
(22) PCT Filed: Nov. 23, 2000
(86) PCT No.: PCT/EP00/11644
§ 371 (c)(1),
(2), (4) Date: Jul. 26, 2001
(87) PCT Pub. No.: WO01/39272
PCT Pub. Date: May 31, 2001

(30) Foreign Application Priority Data

Nov. 29, 1999 (EP) .......................... 99204018
Sep. 15, 2000 (EP) .......................... 00203209

(51) Int. Cl.[7] .................................. H01J 27/15
(52) U.S. Cl. ................... 313/506; 313/504; 313/505
(58) Field of Search ..................... 313/505, 504, 313/506, 500; 445/24, 52; 345/82; 427/66

(56) References Cited

U.S. PATENT DOCUMENTS 5,701,055 A    12/1997  Nagayama et al. ......... 313/504
5,773,931 A  * 6/1998  Shi et al. ................... 313/509
5,929,562 A  * 7/1999  Pichler ....................... 313/506
5,949,188 A  * 9/1999  Leising et al. ............. 313/505
5,977,704 A  * 11/1999 Shi et al. ................... 313/504
6,087,772 A  * 7/2000  Ootsuki et al. ............ 313/505
6,194,837 B1 * 2/2001  Ozawa ...................... 315/169.1
6,290,563 B1 * 9/2001  Codama et al. ............ 445/24
6,306,559 B1 * 10/2001 Tanamura et al. ......... 430/315
6,351,066 B1 * 2/2002  Gyoutoku et al. ......... 313/504
6,452,330 B1 * 9/2002  Steffensmeier ............ 313/505
6,575,800 B1 * 6/2003  Kobayashi et al. ........ 445/24

FOREIGN PATENT DOCUMENTS

EP        0880303         11/1998   .......... H05B/33/10
EP        0982974 A  *   1/2000    .......... H05B/33/10
JP        11074083 A *   3/1999    .......... H05B/33/22
WO        WO 99/12395 *  3/1999    .......... H05B/33/10
WO        WO 99/12398 *  3/1999    .......... H05B/33/24
WO        WO 99/21936    5/1999
WO        WO9921936      5/1999    .......... C09K/11/06

* cited by examiner

Primary Examiner—Ashok Patel
Assistant Examiner—Glenn Zimmerman

(57) ABSTRACT

An organic electroluminescent device (41) has a plurality of independently addressable electroluminescent elements (51A, B, C, D, E, F) and comprises a patterned first electrode layer comprising a plurality of first electrodes (43A, B, C) and a second electrode layer (26A, B, C, D); an organic, optionally patterned, electroluminescent layer (25) disposed between said first and said second electrode layer; an organic charge transport layer having charge transport areas (24A, B, C, D, E, F) disposed between the first electrode layer and the organic electroluminescent layer (25); and a relief pattern (27) extending between and along neighboring first electrodes. The relief pattern separates said charge transport areas along neighboring first electrodes which has the effect of disconnecting any current path between neighboring first electrodes via the charge transport layer. Thus, the EL device has a small leakage current and can be easily manufactured.

10 Claims, 4 Drawing Sheets

ORGANIC ELECTROLUMINESCENT DEVICE AND A METHOD OF MANUFACTURING THEREOF

TECHNICAL FIELD

Figure 1:
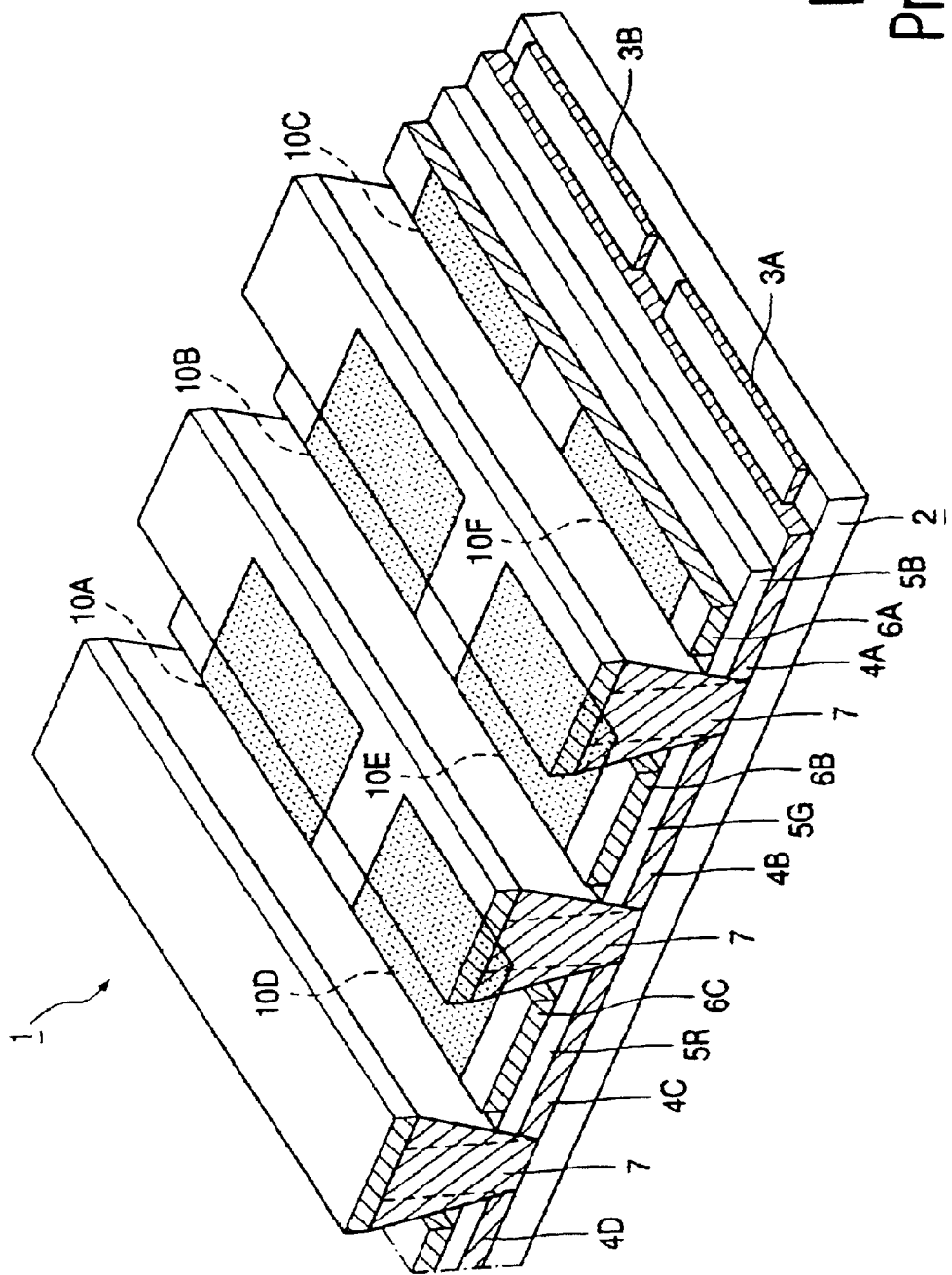

The invention relates to an organic electroluminescent device having a plurality of independently addressable electroluminescent elements and a method of manufacturing thereof.

BACKGROUND AND SUMMARY

Generally, an organic electroluminescent (EL) device comprises at least a hole-injecting (an anode), an electron-injecting electrode (a cathode) and, sandwiched therebetween, an EL layer comprising an organic EL material. If a suitable voltage is applied to the electrodes, holes and electrons are injected from the electrodes. Recombination of a hole and electron inside the organic EL layer leads to emission of a photon, i.e. light. Using different organic EL materials, the color of the light emitted can be varied.

An organic EL device can be used as a light source, in particular one having a large surface area. Organic EL devices comprising a plurality of independently addressable electroluminescent elements (hereinafter also referred to as pixels) are particularly suitable for display purposes such as a monochrome or multi-color display device, a back light, a still image display, a segmented display device, or a matrix display of the passive or active type.

In the International patent application WO 99/21936, an organic EL device is disclosed which comprises a polymeric EL layer disposed between a hole-injecting electrode and a Ca electron-injecting electrode. To facilitate hole injection and hole transport, the indiumtinoxide (ITO) hole injecting electrode is provided with a hole injecting/transport layer of poly-3,4-ethylenedioxythiophene (PEDOT) deposited by means of spin-coating. Alternatively, poly-aniline (PANI) may be used. In the context of the invention the terms "charge injecting layer", "charge transport layer" and "charge injecting/transport layer", where charge refers to a hole and/or electron, are used interchangeably.

Efforts to modify the known EL device so as to obtain an EL device comprising a plurality of independently addressable EL elements by providing patterned electrode layers gave unsatisfactory results. When being driven at constant current, the brightness of a particular EL pixel was found to depend on the image to be displayed by addressing a number of EL pixels. In particular it appeared that the brightness of the light emitted by a particular addressed pixel was inversely proportional to the number of neighboring EL which are also addressed.

It is an object of the invention to provide, inter alia, an electroluminescent device comprising a plurality of independently addressable electroluminescent elements which does not have the above-mentioned disadvantage. Specifically, the invention aims to provide an EL device in which each EL pixel can be individually addressed without its brightness of emission being dependent on whether or not its neighboring pixels are addressed. This is to be the case even and in particular if the EL device is manufactured using a method in which at least a charge transport layer is processed from solution using a wet coating method such as spin-coating. Moreover, the EL device is to have a structure such that it can be manufactured using a simple and cost-effective manufacturing method.

In accordance with the invention, these and other objects are achieved by an organic electroluminescent device comprising a plurality of independently addressable electroluminescent elements, said device comprising:

a patterned first electrode layer comprising a plurality of first electrodes;

a second electrode layer;

an organic, optionally patterned, electroluminescent layer sandwiched between said first and said second electrode layer;

an organic charge transport layer having mutually separate charge transport areas which are positioned between the electroluminescent layer and the first electrode layer; and a relief pattern separating said charge transport areas along each first electrode and between neighboring first electrodes.

In the EL device in accordance with the invention each EL pixel can be individually addressed such that, when driven at constant current, the brightness at which the pixel emits is substantially independent of whether any of the pixels neighboring the addressed pixel are addressed as well. This is even and in particular the case if the organic charge transport layer is provided from solution using a wet coating method such as spin-coating. An essential aspect of the invention is the relief pattern. It allows the charge transport layer to be patterned using a (non-selective) wet coating method in a simple and cost-effective manner.

In one respect, the invention is based on the insight that in the known EL device modified to include patterned electrode layers the charge transport layer is provided as a continuous layer. The continuous layer, being positioned directly adjacent the first electrode layer, connects first electrodes of different pixels. If a particular pixel is addressed, a leakage current flows to any non-addressed pixel neighboring the addressed pixel via the continuous charge transport layer. In contrast, no such leakage current flows between neighboring addressed pixels as their first electrodes are at the same potential. In the case of a floating electrode arrangement, the leakage current causes non-addressed EL elements neighboring the addressed pixel to inadvertently emit light as well. In order to substantially suppress the leakage current, the charge transport areas which are positioned between the EL and the first electrode layer are mutually separated along neighboring first electrodes. Being mutually separate no current can flow between these areas.

In addition, the invention is based on the finding that, in order to be able to provide a charge transport comprising such transport area in a simple and cost-effective manner and thus an EL device comprising such a layer, the EL device is to be provided with a relief pattern which extends between and along neighboring first electrodes. Surprisingly, the relief pattern allows the said patterned charge transport layer to be obtained using a wet coating method such as spin-coating. In the case of a non-selective coating method, it is observed that, as a suitable height and width of the relief pattern, the wet film containing the charge transport layer material or precursor material thereof which initially floods the entire substrate surface breaks up in mutually separate fluid areas extending along and between the relief pattern such that no charge transport material is left on top of the relief pattern. The fluid areas are then converted into charge transport areas which are separated along neighboring first electrodes. Furthermore, being separated along neighboring first electrodes the charge transport area are laid out such that first electrodes sharing a common second electrode are covered by different charge transport areas which is important in a floating electrode arrangement.

In EP-A-0880303 an EL device is disclosed comprising a plurality of independently addressable elements having a charge transport layer and a relief pattern in the form of banks. The purpose of the banks is to prevent the spreading of solution containing luminescent layer material provided by means of ink-jet printing into unwanted areas. Its purpose is therefore quite different from the purpose of the relief pattern in the present invention which is to assist in providing charge transport areas separated along neighboring first electrodes. Furthermore, the charge transport layers of EP-A-0880303 are patterned, if at all, in a different manner. EP-A-0880303 does not disclose an organic charge transport layer having mutually separate charge transport areas which are positioned between the electroluminescent layer and the first electrode layer and are separated along neighboring first electrodes. Also, the present invention allows the charge transport layer to be made substantially thinner (thickness typically less than 10% of height of relief pattern) than the charge transport layers disclosed in EP-A-0880303 which not only saves charge transport material but also allows the use of light-absorbing charge transport materials such as PANI and PEDOT.

The organic electroluminescent device in accordance with the invention comprises a plurality of independently addressable electroluminescent elements (pixels). Each EL element has an area capable of light emission. The light emissive area is part of the EL layer. The light emissive area of a pixel is defined by the area of overlap of a first electrode, a second electrode, a charge transporting area and an organic EL layer. The EL device may be a segmented or matrix display device of the passive or active type. The plurality of first electrodes is provided in the form of a first, if required patterned, electrode layer. Similarly, the second electrodes are provided in the form of a second, optionally patterned, electrode layer.

The second electrode layer may comprise one or more common electrodes. A common electrode is one which serves as the second electrode of more than one EL element.

In a (multi-color) segmented display device, generally the second electrode layer comprises and the first electrode layer may comprise common electrodes.

In a matrix display of the active type EL elements are driven by means of, for example, thin film transistors. Generally, an active matrix device comprises a common second electrode and the first electrodes are independently addressable.

In a matrix display device of the passive type, the first and second electrodes of the EL elements form a plurality of row and column electrodes respectively which cross each other at right angles, each row and column being a common electrode. Wherever a row and a column electrode cross each other, an EL element is formed.

The first electrode layer may be electron-injecting and the second electrode layer hole-injecting. Alternatively, the first electrode layer is hole injecting and the second electrode layer is electron injecting.

An electron-injecting electrode is suitably made of a metal (alloy) having a low work function, such as Yb, Ca, Mg:Ag Li:Al, Ba or is a laminate of different layers such as Ba/Al or Ba/Ag electrode.

A hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

The EL layer is made of a substantially organic, electroluminescent material. In the context of the invention the choice of EL material is not critical and EL material known in the art can be used. Suitable such materials include organic photo- or electroluminescent, fluorescent and phosphorescent compounds of low or high molecular weight. Suitable low molecular weight compounds are well known in the art and include tris-8-aluminium quinolinol complex and coumarins. Such compounds can be applied using vacuum-deposition method.

Suitable EL polymers have a saturated main-chain provided with electroluminescent, fluorescent side-groups such as polyvinylcarbazole. Preferred high molecular weight materials contain EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly(alkyl)fluorenes and poly-p-phenylenevinylenes with emit red, yellow or green light and are 2-, or 2,5-substituted poly-p-phenylenevinylenes, in particular those having solubility-improving side groups at the 2- and/or 2,5 position such as $C_1$–$C_{20}$, preferably $C_4$–$C_{10}$, alkyl or alkoxy groups. Preferred side groups are methyl, methoxy, 3,7-dimethyloctyloxy, and 2-methylpropoxy. More particularly preferred are polymers including a 2-phenyl-1,4-phenylenevinylene repeating unit, the phenyl group being optionally substituted with alkyl and/or alkoxy groups of the type above, in particular methyl, methoxy, 3,7-dimethyloctyloxy, or, better still, 2-methylpropyoxy. The organic material may contain one or more of such compounds. Such EL polymers are suitably applied by wet deposition techniques. The wet deposition technique may be selective or non-selective. Non-selective coating methods include spin-coating, web-coating, doctor blade, spray coating, roller coating or casing. Selective deposition techniques include printing methods such as ink-jet printing, dispensing (or a continuous jet), screen printing, off-set printing, lithography and tampon printing.

In the context of the invention, the term organic includes polymeric whereas the term polymer and affixes derived therefrom, includes homopolymer, copolymer, terpolymer and higher homologues as well as oligomer.

Optionally, the organic EL material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 nm to 150 nm, preferably, 70 nm to 100 nm.

The EL device comprises a charge transport layer situated between the EL layer and the first electrode layer. If the first electrode layer is electron-injecting, the charge transport layer is an electron transport layer, whereas if it is hole-injecting the charge transport layer is a hole transport layer.

Suitable materials for the hole-injecting and/or hole-transport layers (HTL) include aromatic tertiary amines, in particular diamines or higher homologues, polyvinylcarbazole, quinacridone, porphyrins, phthalocyanines, poly-aniline and poly-3,4-ethylenedioxythiophene.

Suitable materials for the electron-injecting and/or electron-transport layers (ETL) are oxidiazole-based compounds and aluminiumquinoline compounds.

If ITO is used as the anode, the EL device preferably comprises a 50 to 300 nm thick layer of the hole-injecting/-transport layer material poly-3,4-ethylenedioxythiophene or a 50 to 200 nm thick layer of polyaniline.

Optionally, the EL device comprises additional layers disposed between the electrodes. Such additional layers may be hole-injecting and/or transport (HTL) layers and electron-injecting and transport (ETL) layers. Examples are EL devices comprising a laminate of anode/HTL layer/EL layer/cathode, anode/EL layer/ETL layer/cathode, or anode/HTL layer/EL layer/ETL layer/cathode.

Generally, the EL device comprises a substrate. Preferably, the substrate is transparent with respect to the light to be emitted. Suitable substrate materials include transparent synthetic resin which may or may not be flexible, quartz, ceramics and glass.

The EL device comprises a relief pattern which extends between and along neighboring first electrodes. The purpose of the relief pattern is to allow the charge transport areas to be obtained using a, preferably non-selective wet coating method. In order to prevent leakage current or short circuits, the relief pattern is made from electrically insulating material.

The height, width and shape of the transverse profile of the relief pattern has to be selected such that the fluid layer from which the charge transport layer is obtained breaks up in mutually separate fluid areas and the top of relief pattern is rid of charge transport material.

Which width and height in a given set of circumstances provides the above-mentioned break-up effect depends on many factors in particular on the rheological properties of the fluid to be deposited and the dimension of the spaces outlined by the relief pattern. General guidelines are difficult to give, but suitable widths and heights are easily determined empirically by performing experiments in which the height and width of the relief pattern is varied.

Although not wishing to be bound by any theory, two driving forces are considered to be operative in the break-up of the fluid layer and dewetting the top of the relief pattern. First, the positive pressure gradient due to the curvature of the relief pattern forces the fluid away from the top of the relief pattern. Secondly, Marangoni stress caused by a difference in concentration developed during removal of the solvent between fluid present on top of and between the relief pattern results in the transport of fluid away from the relief pattern. When the fluid layer becomes very thin van der Waasl forces which promote the dewetting come into play. The dewetting of the relief pattern is slowed down by the increase in viscosity of the fluid layer due to evaporation of the solvent. If the width of the relief pattern increases more fluids has to be transported away from the top of the relief pattern. So in order to rid the relief pattern of charge transport material, all fluids has to be drained before the gel point is reached.

A suitable width may be found in the range 1 to 200 $\mu$m, or better 2 to 150 $\mu$m, preferably 10 to 20 $\mu$m, a suitable height of 1 to 30 $\mu$m, a preferable height 2 to 6 $\mu$m. Most preferably, the height is 3 to 5 $\mu$m. The shape of the transverse profile of the relief pattern is not critical. It is suitably rectangular, may even be negatively-sloped, that is with overhanging sections, but a relief pattern is or of which the base section is positively-sloped is preferred, as such an arrangement promotes the transport of fluid from the relief pattern into the spaces defined by the relief pattern. More preferably, the transverse profile of the relief pattern is rounded having gradual changes, substantially crescent shaped. Evidently, the layout of the relief pattern depends on the type of EL device (segmented, passive matrix, active matrix etc).

Although any patterning technique may be used to provide the relief pattern, the relief pattern is preferably obtained by photolithographically patterning a conventional photoresist.

In a preferred embodiment of the electroluminescent device in accordance with the invention, the relief pattern has positively-sloped sections.

In the context of the invention a section of the relief pattern is positively-sloped if the tangents in the plane of the transverse profile all make an angle smaller than 90° with the surface supporting the relief pattern, the angle being measured as passing through the relief pattern. The opposite of a positively-sloped section is an overhanging section, the overhang extending in a direction parallel to the supporting surface.

Being positively-sloped, any second electrode layer covering at least partially the relief pattern is able to follow the profile of the positively-sloped while not being interrupted by it. In particular the second electrode layer is not interrupted by the relief pattern in the case of a vacuum deposited second electrode layer. A rectangular or overhanging section of the relief pattern would cause the second electrode layer to be interrupted, possible at undesired locations. In order to prevent such undesired interruption the substrate would have to be planarized prior to deposition of the second electrode layer. Because in the EL devices in accordance with the invention there is no need to planarize, a charge transport layer having a thickness much smaller than the height of the relief pattern can be used.

The use of a relief pattern having positively-sloped sections is particularly relevant in the case of a passive matrix display because the row electrodes must cross the relief pattern in an uninterrupted manner. Therefore a preferred embodiment of the electroluminescent device in accordance with the invention is characterized in that the electroluminescent device is a display device of the passive matrix type wherein the plurality of first electrodes is a plurality of row electrodes, the second electrode layer comprises a plurality of independently addressable column electrodes which cross the row electrodes and the relief pattern.

The relief pattern may or may not be used to pattern the second electrode. If the relief pattern has a rectangular or positively-sloped transverse profile, the second electrode forms, if deposited by means of a vapor in vacuo, a single continuous electrically conductive layer covering both the relief pattern and the EL layer. If the relief pattern is positively-sloped, the second electrode can be patterned using an external shadow. In order to prevent any fluid which is initially deposited on top of the relief pattern from remaining there, draining means may be employed such as a relief pattern having a roof-like or gutter-like structure.

Another embodiment of the EL device in accordance with the invention is characterized in that the relief pattern has an overhanging section rendering the relief pattern suitable for patterning the second electrode.

If the second electrode is deposited by means of vacuum deposition, which is generally the case, the overhanging serves as shadow mask for the deposition of second electrode material. When exposed to the material flux from which the second electrode is deposited in vacuo, the overhanging section prevents the deposition of electrode material at the locations which are in the shadow region provided by the overhanging section thus obtaining a patterned second electrode. Examples of relief patterns having an overhanging section are relief patterns having a T-, a mushroom-, or an inverse trapezoidal- or triangular-shaped transverse profile. Further examples and methods of manufacturing a relief pattern having overhanging section are disclosed in U.S. Pat. No. 5,701,055. The width of the overhanging section is not critical. In overhanging sections of 1 to 2 $\mu$m or less the risk of two neighboring second electrodes being electrically connected unintentionally is unacceptable. A suitable width of the overhanging section is 2 to 10 $\mu$m. A preferred relief pattern has an inverse trapezoidal transverse profile with a base of 5 to 10 $\mu$m and a top of 15 to 30 $\mu$m. If the substrate is not rotating during the deposition process of the second electrode, the overhanging section may be even smaller.

A particularly suitable embodiment of the EL device is characterized in that the relief pattern is a composite relief pattern of a first relief pattern for containing the fluid layer of the charge transport layer and a second relief pattern having an overhanging section rendering the second relief pattern suitable for patterning the second electrode.

The second relief pattern is situated on the side of the first relief pattern facing the second electrode. Such a composite relief pattern can be obtained by performing two photolithographic patterning steps in succession starting with the first relief pattern. The first relief pattern is hard-baked so as to be able to withstand the processing required to provide the second pattern. Alternatively, the first relief pattern may be made of a polyimide or a polyamide or any other photo-patternable material which is not soluble in solvents used to process photo-resists of the second relief pattern.

As the EL device requires only a few volts to provide a brightness suitable for display purposes and/or consumes a small amount of power the EL device is particularly suitable for displays of battery operated and/or portable, in particular hand-held, electronic equipment such as lap top computers, palm top computers, personal organizers, mobile phones optionally provided with internet access or other services requiring the presentation of (video) images. The EL device allows internet data and video data to be displayed.

In another aspect, the invention therefore relates to a battery-operated and/or hand-held electronic device, such as a mobile phone, provided with an EL display device in accordance with the invention.

In a further aspect, the invention relates to a method of manufacturing an organic electroluminescent device comprising a plurality of independently addressable electroluminescent elements, said method comprising:

providing a patterned first electrode layer comprising a plurality of first electrodes;

providing a relief pattern extending between and along neighboring first electrodes;

depositing a fluid layer comprising organic charge transport material or a precursor material thereof;

converting the fluid layer into an organic charge transport layer having mutually separate charge transport areas which are positioned between the electroluminescent layer and the first electrode layer and which are mutually separated along each first electrode and along neighboring first electrodes;

providing at least one, optionally patterned, electroluminescent layer; and providing an, optionally patterned, second electrode layer.

Because the charge transport layer is provided as a patterned layer comprising charge transport areas mutually separated along neighboring first electrodes instead of a continuous layer, the method in accordance with the invention provides an EL device in which the resistance between first electrodes is substantially lowered and the leakage current between first electrodes is substantially reduced, a reduction by a factor of 10 being easily realized. An essential aspect of the method in accordance with the invention is the relief pattern which allows the charge transport to be patterned using a wet coating method. Use of a wet coating method renders the method in accordance with the invention simple and cost-effective as such wet coating methods are simple, cost-effective, allow high through-puts and are suitable for coating large surfaces.

Surprisingly, with the aid of the relief pattern, the charge transport layer can even be patterned using a non-selective wet coating method which makes the method in accordance with the invention even more attractive.

Preferred, therefore, is a method in accordance with the invention wherein the steps of depositing and converting the fluid layer comprise:

depositing the fluid layer non-selectively in a quantity sufficient to flood both the plurality of first electrodes and the relief pattern, and converting the fluid layer into the organic charge transport layer, wherein during conversion the fluid layer breaks up in mutually separate fluid areas which extend up between and along the relief pattern, which fluid areas are then converted into the mutually separate charge transport areas.

As already described above, at suitable heights and widths of the relief pattern, the fluid layer deposited by the non-selective wet coating method which initially floods the entire substrate breaks up into separate fluid areas filling the spaces between the relief pattern and ridding the relief pattern of fluid. During conversion of the fluid layer, fluid is drained from the top of the relief pattern. When the fluid areas are converted into corresponding charge transport areas, the charge transport layer is patterned such that none of the charge transport areas connects mutually separated first electrodes. Also, if the second electrode layer comprises one or more common electrodes, the layout of the relief pattern is selected such that first electrodes sharing a common second electrode are covered by different charge transport areas.

Suitable wet coating methods, of both the selective and non-selective type, first and second electrodes layers, organic EL layers, organic electroluminescent materials, charge transport layers and relief patterns have already been disclosed hereinabove.

In the context of the invention, fluid is understood to mean any deformable mass capable of flowing under pressure and includes suspensions, solutions, emulsions, dispersions, pastes, inks, lacquers and the like.

The fluid layer from which the organic charge transport layer is obtained comprises the charge transport material or a precursor material thereof. After the fluid layer is deposited it is converted to the charge transport layer. The conversion may involve exposing, if required in an inert atmosphere, the fluid layer to increased or reduced temperatures, increased or reduced pressure, and/or radiation. Preferably, the conversion is performed at an elevated temperature.

If the charge transport material is present as such in the fluid layer, it may be sufficient to evaporate a solvent and/or other volatile components. If the fluid layer contains a precursor material of the charge transport material the conversion also involves a chemical reaction. The wealth of chemical reactions known to those skilled in the art of chemistry may be exploited to derive suitable precursor materials. A preferred precursor material contains leaving groups which are eliminated during the conversion.

The fluid layer may contain further substances. For example, substances which modify its rheological properties such as viscosity, (visco)elasticity, contact angle and/or wettability. Wetting agents, leveling agents, surfactants, thickening agents, diluents and the like may be added. Alternatively, the surface properties of the relief pattern can be modified by performing an anti-wetting treatment. In the case of a water-based fluid this can be done by subjecting the relief pattern to $CF_4$ to $CHF_3$ plasma treatment.

The type of non-selective coating method is not critical and can be, for example, dip-coating, spray coating, curtain coating, doctor blade, web coating, spin-coating, and Langmuir-Blodgett. Nonetheless, quite unexpectedly, the patterned charge transport layer could be deposited in a uniform manner over a large surface using spin-coating. After all, in general, spin-coating is a method suitable for coating a planar substrate or for providing a planarized layer on a relief patterned substrate. In contrast, as those skilled in the art will agree, one does not expect that is possible to reliably spin-coat a layer on a relief patterned substrate if the thickness of the layer to be provided is much less the height of the relief pattern. In the context of the present invention, the thickness of the charge transport layer is typically 100 nm whereas the height of the relief pattern is typically 3 to 5 $\mu$m.

BRIEF DESCRIPTION OF THE DRAWING FIGURES

These and other aspects of the invention will be apparent from and elucidated with reference to the embodiments described hereinafter.

Figure 2:
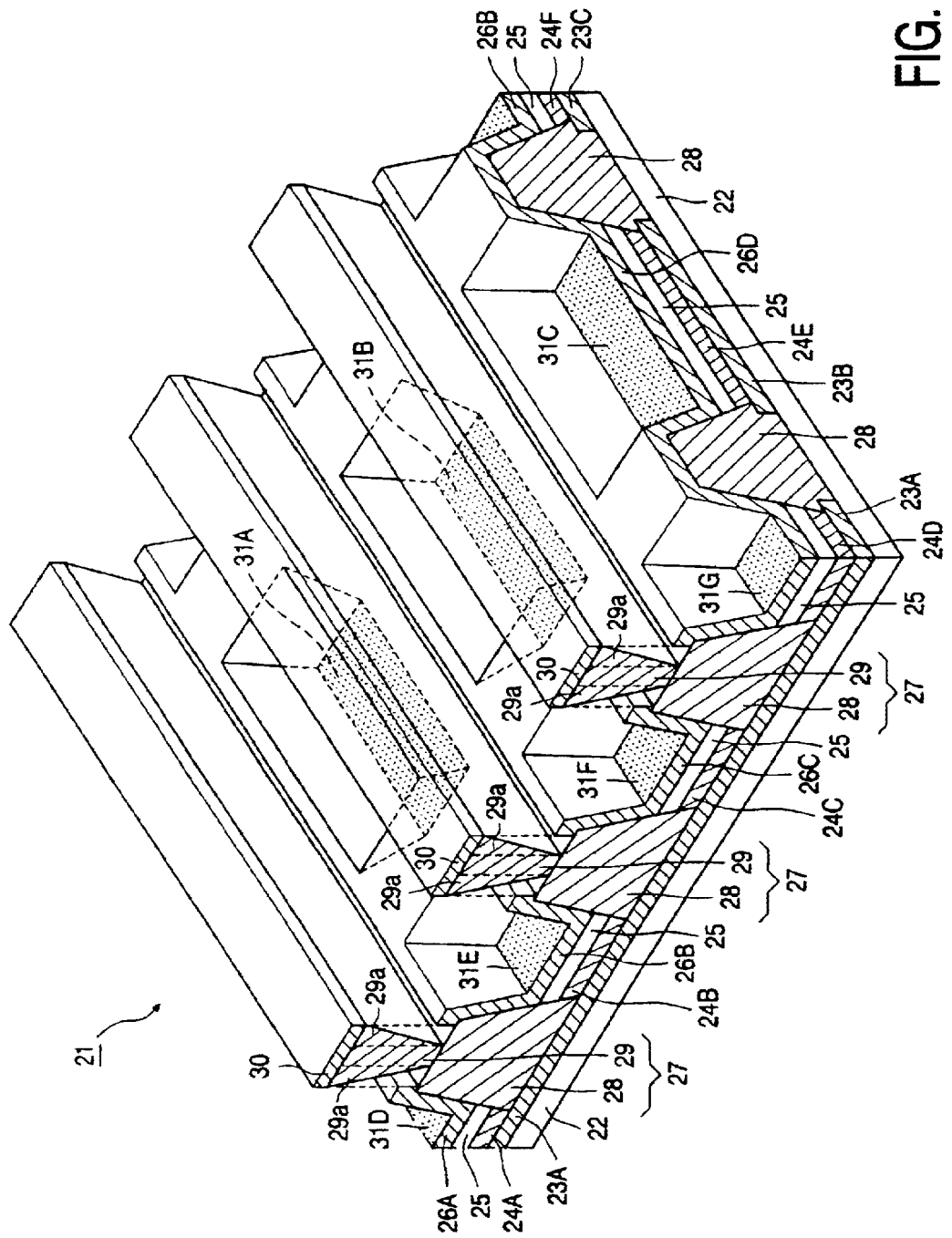
Figure 3:
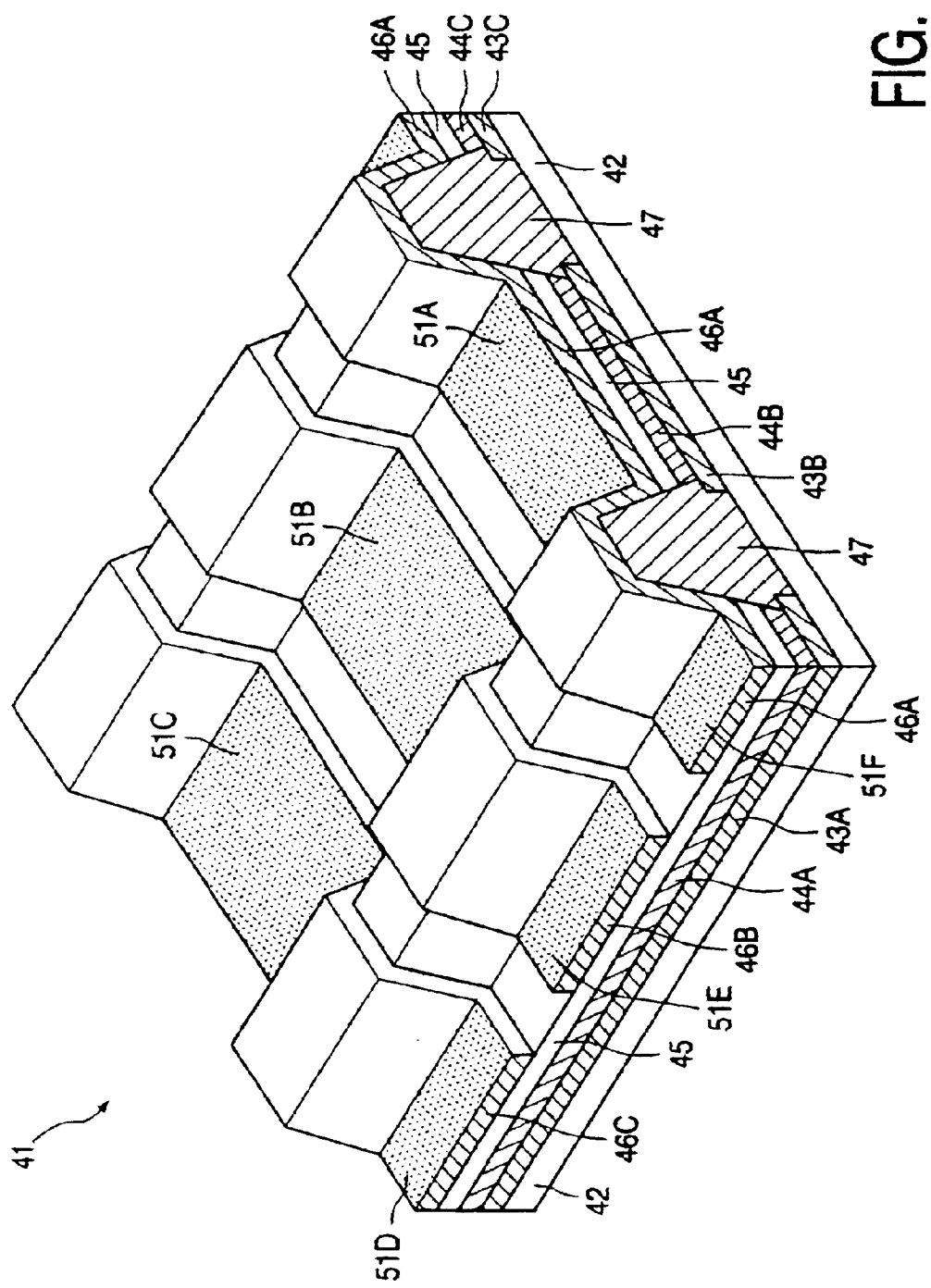
Figure 4:
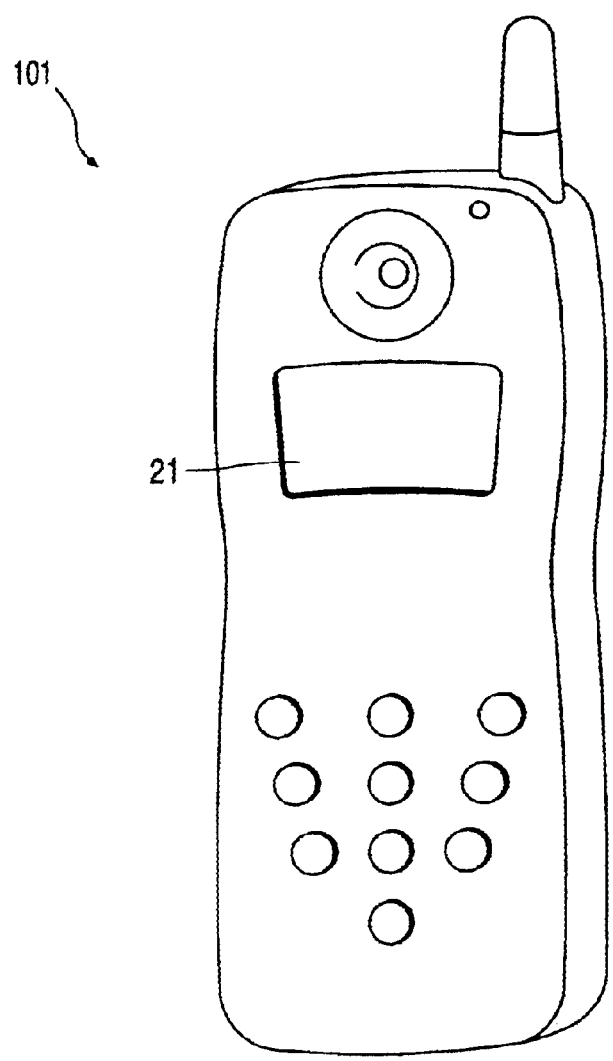
Figure 5:
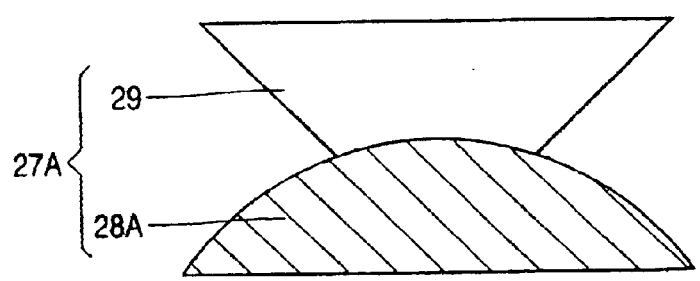

In the drawings:

FIG. 1 schematically shows, in a partially worked-open perspective plan view, a part of an organic EL passive matrix display device in accordance with the prior art, FIG. 2 schematically shows, in a perspective plan view, a part of an organic EL matrix display device in accordance with the invention, FIG. 3 schematically shows, in a perspective plan view, a part of a further organic EL matrix display device in accordance with the invention, FIG. 4 schematically shows a mobile phone provided with an EL device in accordance with the invention, and FIG. 5 shows a transverse profile of a relief pattern for use in an EL device in accordance with the invention.

DETAILED DESCRIPTION

Embodiment 1 (not in accordance with the invention)

FIG. 1 schematically shows, in a partially worked-open perspective plan view, a part of an organic EL passive matrix display device 1 not in accordance with the invention.

The EL device 1 has a (with respect to the light to be emitted transparent) substrate 2 provided with a plurality of independently addressable EL elements (EL pixels) 10A, 10B, 10C, 10D, 10E, 10F formed by the area of overlap of a first electrode layer comprising first electrodes in the form of row electrodes 3A and 3B, a charge transport layer comprising mutually separate charge transport areas 4A, 4B 4C and 4D, a patterned EL layer 5R, 5G, 5B and a second electrode layer comprising column electrodes 6A, 6B, 6C. The separate areas 5R, 5G and 5B of the EL layer may each emit light of a different color such as red, green and blue. The row electrodes 3A and 3B are each common electrodes.

For example, the row electrode 3A provides electrodes for the EL elements 10D, 10E and 10F. Each of the column electrodes 6A, 6B, 6C is a common second electrode providing electrodes for a number of EL elements.

The EL device 1 further comprises a relief pattern 7 which divides the charge transport layer into mutually separate transport areas 4A, 4B, 4C and 4D. However in contrast to the invention, these areas are not separated along neighboring first electrodes as the relief pattern 7 does not extend along and between the neighboring first electrodes. The charge transport 4A connects the first electrodes 3A and 3B and a leakage current can flow via the areas 4A between the electrodes 3A and 3B when only one of them is addressed by applying a suitable voltage and the other one is maintained at a potential of 0 V. Alternatively, when the electrodes 3A and 3B are provided in a floating electrode arrangement individually addressing EL pixel 10B causes EL pixel 10E to emit light as well.

Embodiment 2 (in accordance with the invention):

a) device structure

FIG. 2 schematically shows, in a perspective plan view, a part of an organic EL passive matrix display device 21 in accordance with the invention.

FIG. 4 schematically shows a mobile phone 101 provided with the EL device 21 in accordance with the invention.

Embodiment 1 (Prior Art)

The EL device 21 has a (transparent) substrate 22 provided with a plurality of independent addressable EL elements (EL pixels) 31A, 31B, 31C, 31D, 31E, 31F, 31G formed by the area of overlap of a patterned first electrode layer of first electrodes in the form of row electrodes 23A, 23B and 23C, a charge transport layer comprising charge transport areas 24A, 24B, 24C, 24D, 24E, 24F, a patterned EL layer 25 and a second electrode layer of column electrodes 26A, 26B, 26C and 26D. The EL layer 25 may be split in EL layers capable of emitting red, green and blue light respectively in order to obtain a multi-color device.

The EL device 21 further comprises a composite relief pattern 27 comprising a first and second relief pattern 28 and 29 respectively.

The relief pattern 28, extends, inter alia, along and between neighboring row electrodes 23A, 23B and 23C. The relief pattern 28 separates the charge transport areas 24A, 24B, 24C, 24D, 24E, 24F along neighboring first electrodes 23A, 23B4 and 23C. The relief pattern also separates, but this is not essential for the invention, said areas along the column electrodes 26A, 26B, 26C and 26D. The relief pattern 28 is positively-sloped which enables the column electrodes 26A, 26B, 26C to be provided as continuous conducting strips which follow the contours of and are not interrupted by the first relief pattern 28 whenever the column electrodes cross the relief pattern 28.

The composite relief pattern 27 further comprises a second relief pattern 29 having overhanging sections 29a which render the composite relief pattern suitable for patterning the column electrodes 26A, 26B, 26C into mutually independently addressable column electrodes. The relief pattern 29 is inessential for the invention. The second relief pattern 29 is provided on top of the first relief pattern 28, that is on the surface of the first relief pattern which faces away from the row electrodes 23. If, for example, the column electrodes 26A, 26B, 26C are deposited by means of vacuum deposition of metal vapor the overhanging sections 29a create shadow regions with respect to a vapor flux directed at right angles to the substrate in which no material is deposited whereas the positively-sloped first relief pattern 28 does not provide such a shadow region. In this manner column electrodes are formed which are mutually electrically disconnected.

If the relief pattern 29 is used as a built-in shadow mask non-functional material 30 is present on top of the relief pattern.

The charge transport layer has charge transport areas 24A, 24B, 24C, 24D, 24E, 24F positioned between the EL layer 25 and the first electrodes 23A, 23B and 23C, which are at least separated along neighboring first electrodes.

As a result, first electrodes are not connected via any charge transport area and a leakage current cannot flow via any of said areas between neighboring electrodes. Alternatively, in a floating electrode arrangement, the separation of the charge transport areas along neighboring electrodes make sure that column electrodes sharing the same row electrode are covered by different charge transport areas.

b) example of manufacture

The EL device 21 can be manufactured as follows: A substrate 22 of 1.1 mm thick sodalime glass coated with a 15 Ω/square 150 nm thick ITO layer (Balzers) is provided and the ITO layer patterned in a 280 μm wide lines and 30 μm wide spaces pattern in a conventional manner to obtain the first electrode layer comprising first electrodes in the form of row electrodes 23A, 23B and 23C which serve as the anodes of the EL elements 31A–G.

In order to provide the first relief pattern 28 of the composite pattern 27, the substrate is spin-coated with conventional photoresist, the photoresist exposed using a mask and developed. The relief pattern 28 is a 40/270 μm lines/spaces pattern and extends between and along neighboring first electrodes 23A–C. The height of the relief pattern 28 is 4 μm. The relief pattern 28 is then hard-baked so as to render it resistant to the process of providing the relief pattern 29.

The substrate is then spit-coated (1000 rpm) with a layer of the image reversal photoresist AZ5218-e (AZ Hoechst). The photoresist is exposed pattern-wise using a mask having a 20/290 μm lines/spaces pattern at right angles to the row electrodes 3A, 3B in proximity (40 μm gap) with a dose of 32 mJ/cm$^2$, hard-baked at 110° C. for 10 min, flood exposed with a dose of 400 mJ/cm$^2$, developed using a 1:1 AZ-developer:DI-water developer for a time sufficient to obtain a negative slope of 45°, and post-baked at 100° C. for 15 min. This results in a 30/280 μm lines/spaces relief pattern 29 having overhanging sections 29a. Each line has an inverted trapezoidal shape which measures 30 μm at the top and 20 μm at the base. The height of the relief pattern 29 is 2.0 μm. The total height of the relief pattern 27 is 6.0 μm.

FIG. 5 shows a transverse profile of an alternative composite relief pattern 27A for use in an EL device in accordance with the invention. It comprises a rounded, crescent-shaped relief pattern 28A. The rounded shape can be obtained by hard-baking the relief pattern 28 for an extended period of time at a sufficiently high temperature.

A water-based poly-3,4-ethylenedioxythiophene (PEDOT) solution of 3% solid content (supplier Bayer) is then spin-coated over the relief pattern 27 at 2000 rpm resulting in a fluid layer of average thickness 8.3 μm which floods the relief pattern 27 and the first electrode layer. While converting the fluid layer by spinning at 2000 rpm and 130° C. for 3 min, the relief pattern 28 forces the fluid layer to break up into fluid areas mutually separated along the relief pattern 28 and thus along the first electrodes 23A, 23B and 23C. No charge transport material is left on top of the relief patterns 28 and 29. It also breaks up along the second electrodes 26A, 26B, 26C but this is not essential for the invention. Upon further drying, the fluid areas gel and are converted into the charge transport areas 24A, 24B, 24C, 24D, 24E, 24F. The areas are 250 nm thick and have a square resistance of 100 MΩ/square.

Subsequently, a 0.6% by weight solution of the polymer of formula (1)

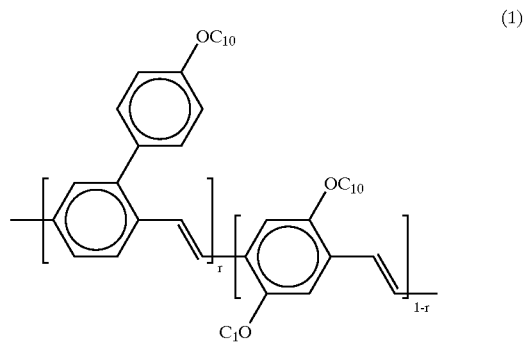

wherein —OH$_{10}$ designates 3,7-dimethylocytloxy, r and 1-r equal 0.5 and indicate the proportion of units having the structure indicated in brackets, to which, respectively, r and 1-r is suffixed (hereinafter also referred to as NRS-PPV) in toluene is spin-coated at 1250 rpm, which results in a fluid layer of average thickness 11.6 μm. The copolymer is synthesized according to a similar method in WO 99/21936. After drying the wet layer, a patterned organic EL layer 25

While using the relief pattern 29 as a built-in shadow mask, 3 nm thick Ba and 200 nm thick Al layers are successively deposited on top of the EL layer. The patterned Ba/Al layers thus obtained constitute the second electrode layer comprising the plurality of column electrodes (cathodes) 26A, 26B, 26C and 26D.

c) device characteristics

The EL element 31B of the EL device 21 is subjected to a voltage of 2.7 V by connecting the electrode 23B to the positive pole of a voltage source and electrode 26C to the negative pole thereof. The electrodes neighboring the electrode 23B are kept at 0 V. Only the addressed element 31B emits light and the intensity with which it does so is not influenced by the fact whether or not or how many neighboring EL pixels are also addressed.

Embodiment 3 (in accordance with the invention):

Embodiment 2 is repeated using different heights of the first relief pattern 28, viz. 3.0, 8.0, 10.0 and 15.0 μm. In all cases the relief pattern the top of the relief pattern is drained from charge transport material and a charge transport layer interrupted by the relief pattern is formed. If however the height is made too small, for example 1.5 μm, charge transport material remains on top of the relief pattern as the gel point of the fluid layer is reached before all fluids is drained from the top. Similarly, if the width of the relief pattern is increased to 140 μm at a height of 5 μm, the fluid layer does not break up and a continuous charge transport layer results.

Embodiment 4 (in accordance with the invention):

a) device structure

FIG. 3 schematically shows, in a perspective plan view, a part of a further organic EL matrix display device 41 in accordance with the invention.

The EL device 41 has a (transparent) substrate 42 provided with a plurality of independent addressable EL elements (EL pixels) 51A, 51B, 51C, 51D, 51E, 51F formed by the area of overlap of a patterned flask electrode layer of first electrodes in the form of row electrodes 43A, 43B and 43C, a charge transport layer comprising charge transport areas 44A, 44B, 44C a patterned EL layer 45 and a second electrode layer of column electrodes 46A, 46B, 46C. The EL layer 45 may be split in EL layers capable of emitting red, green and blue light respectively in order to obtain a multi-color device.

The EL device 41 further comprises a relief pattern 47 which extends along and between the row electrodes 43A, 43B and 43C. The relief pattern 47 separates the charge transport areas 44A, 44B, 44C along the neighboring electrodes 43A, 43B and 43C. The relief pattern 47 has positively-sloped sections which enables the column electrodes 46A, 46B, 46C to be provided as continuous conducting strips which follow the transverse profile of and are not interrupted by the relief pattern 47 wherever the column electrodes cross the relief pattern 47

The charge transport layer is divided by the relief pattern 47 into charge transport areas 44A, 44B, 44C which are separated along neighboring first electrodes. As a result, first electrodes which share a common second electrode, that is column electrodes sharing the same row electrode, are covered by different charge transport areas. Also, the electrodes 43A, 43B, 43C are not connected via the charge transport layer preventing the flow of any leakage current between these electrodes.

b) example of manufacture

The EL device 41 can be manufactured using the method in the Embodiment 2 under b), except that the relief pattern 47 is provided by means of a single photolithographic step using conventional photoresist and the column electrodes 46A, 46B, 46C are vacuum deposited using an external shadow mask.

c) device characteristics

With respect to the leakage current observed between electrodes the EL device 41 performs similar to the EL device 21. Also, the brightness of an EL pixel is independent of whether any of its neighboring pixels are also addressed.

What is claimed is:

1. An organic electroluminescent device having a plurality of independently addressable electroluminescent elements, said device comprising:
    a patterned first electrode layer including a plurality of first electrodes;
    a second electrode layer;
    an organic, optionally patterned, electroluminescent layer sandwiched between said first and said second electrode layer;
    an organic charge transport layer having mutually separate charge transport areas which are positioned between said electroluminescent layer and said first electrode layer; and
    a relief pattern separating said charge transport areas along each first electrode and between neighboring said first electrodes.

2. The organic electroluminescent device of claim 1, wherein said relief pattern includes positively-sloped sections.

3. The electroluminescent device of claim 1,
    wherein said organic electroluminescent device is a display device of a passive matrix type;
    wherein said plurality of first electrodes are a plurality of row electrodes; and
    wherein said second electrode layer includes a plurality of independently addressable column electrodes crossing said row electrodes and said relief pattern.

4. A battery-operated device provided with said organic luminescent device as claimed in claim 1.

5. A hand-held electronic device provided with said organic luminescent device as claimed in claim 1.

6. A mobile phone provided with said organic luminescent device as claimed in claim 1.

7. A method of manufacturing an organic electroluminescent device comprising a plurality of independently addressable electroluminescent elements, said method comprising:
    providing a patterned first electrode layer including a plurality of first electrodes;
    providing a relief pattern extending along each first electrode, and between neighboring the first electrodes;
    depositing a fluid layer including organic charge transport material or a precursor material thereof;
    converting the fluid layer into an organic charge transport layer having mutually separate charge transport areas which are positioned between the electroluminescent layer and the first electrode layer and which are mutually separated along each first electrode and between neighboring the first electrodes;
    providing at least one, optionally patterned, electroluminescent layer; and
    providing an, optionally patterned, second electrode layer.

8. The method of claim 7,
    wherein the act of depositing a fluid layer comprising organic charge transport material or a precursor material thereof includes an act of depositing the fluid layer non-selectively in a quantity sufficient to flood both the plurality of first electrodes and the relief pattern.

9. The method of claim 7,
    wherein, during the conversion, the fluid layer breaks up in mutually separate fluid areas which extend between and along the relief pattern, which the fluid areas are then converted into the mutually separate charge transport areas.

10. A method of manufacturing an organic electroluminescent device comprising a plurality of independently addressable electroluminescent elements, said method comprising:
    providing a patterned first electrode layer comprising a plurality of first electrodes;
    providing a relief pattern extending between and along neighboring the first electrodes;
    depositing a fluid layer non-selectively in a quantity sufficient to flood both the plurality of first electrodes and the relief pattern, the fluid layer including organic charge transport material or a precursor material thereof;
    converting the fluid layer into an organic charge transport layer having mutually separate charge transport areas which are positioned between the electroluminescent layer and the first electrode layer and which are mutually separated along neighboring the first electrodes,
    wherein, during the conversion, the fluid layer breaks up in mutually separate fluid areas which extend between and along the relief pattern, which the fluid areas are then converted into the mutually separate charge transport areas;
    providing at least one, optionally patterned, electroluminescent layer; and
    providing an, optionally patterned, second electrode layer.

* * * * *